(12) United States Patent
Isozaki et al.

(10) Patent No.: US 11,177,190 B2
(45) Date of Patent: Nov. 16, 2021

(54) SEMICONDUCTOR DEVICE

(71) Applicant: FUJI ELECTRIC CO., LTD., Kawasaki (JP)

(72) Inventors: Makoto Isozaki, Matsumoto (JP); Seiichi Takahashi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/883,464

(22) Filed: May 26, 2020

(65) Prior Publication Data
US 2020/0286807 A1 Sep. 10, 2020

Related U.S. Application Data

(63) Continuation of application No. PCT/JP2019/017626, filed on Apr. 25, 2019.

(30) Foreign Application Priority Data

Jun. 6, 2018 (JP) .............................. JP2018-108437

(51) Int. Cl.
*H01L 23/373* (2006.01)
*H01L 23/057* (2006.01)
*H01L 23/00* (2006.01)
*H01L 25/07* (2006.01)

(52) U.S. Cl.
CPC ........ *H01L 23/3735* (2013.01); *H01L 23/057* (2013.01); *H01L 24/48* (2013.01); *H01L 25/072* (2013.01); *H01L 2224/32155* (2013.01)

(58) Field of Classification Search
CPC ... H01L 23/3735; H01L 23/057; H01L 24/48; H01L 25/072; H01L 2224/32155

USPC .......................................................... 257/695
See application file for complete search history.

(56) References Cited

U.S. PATENT DOCUMENTS

| 5,956,231 A | 9/1999 | Yamada et al. |
| 2012/0153444 A1 | 6/2012 | Haga et al. |
| 2017/0229389 A1 | 8/2017 | Katsuki |

FOREIGN PATENT DOCUMENTS

| JP | H08-78620 A | 3/1996 |
| JP | 2001-094035 A | 4/2001 |
| JP | 3222341 B2 | 10/2001 |
| JP | 2011-249394 A | 12/2011 |
| JP | 5177174 B2 | 4/2013 |
| JP | 5429413 B2 | 2/2014 |

(Continued)

OTHER PUBLICATIONS

International Search Report for PCT/JP2019/017626, dated Jun. 18, 2019.
Written Opinion for PCT/JP2019/017626, dated Jun. 18, 2019.

*Primary Examiner* — Elias Ullah
(74) *Attorney, Agent, or Firm* — Rabin & Berdo, P.C.

(57) ABSTRACT

A semiconductor device, including a first conductive portion including a first conducting region and a first wiring region communicating with the first conducting region via a first communicating portion, a second conductive portion including a second conducting region and a second wiring region that communicates with the second conducting region via a second communicating portion and that faces the first wiring region with a prescribed space therebetween, and a wiring member electrically connecting the first wiring region and the second wiring region in a wiring direction. The first communicating portion and the second communicating portion are separate from each other when viewed from the wiring direction.

15 Claims, 12 Drawing Sheets

(56) References Cited

FOREIGN PATENT DOCUMENTS

| | | |
|---|---|---|
| JP | 2015-167233 A | 9/2015 |
| JP | 2017-135392 A | 8/2017 |
| JP | 2017-139406 A | 8/2017 |

SEMICONDUCTOR DEVICE

CROSS-REFERENCE TO RELATED APPLICATION

This application is a continuation application of International Application PCT/JP2019/017626 filed on Apr. 25, 2019 which designated the U.S., which claims priority to Japanese Patent Application No. 2018-108437, filed on Jun. 6, 2018, the entire contents of which are incorporated herein by reference.

BACKGROUND OF THE INVENTION

1. Field of the Invention

The embodiment discussed herein relates to a semiconductor device.

2. Background of the Related Art

Semiconductor devices include, for example, semiconductor elements such as IGBTs (insulated gate bipolar transistors) and power MOSFETs (metal oxide semiconductor field effect transistors). Such semiconductor devices are used as power conversion devices, for example. A semiconductor device includes a plurality of IGBT chips and a plurality of FWD (freewheeling diode) chips, which are desirably connected to one another with wiring members. With this configuration, the semiconductor device is able to implement desired functions. For such semiconductor devices, increased capacity has been demanded. For example, semiconductor modules configured to be able to handle large current have been demanded (for example, see Japanese Laid-open Patent Publication No. H08-78620).

By the way, if a rated current is increased for capacity enlargement, abnormal overheating may occur in a wiring member, which is not seen in the case of using the appropriate rated current. For example, abnormal overheating occurs in a wire connecting circuit patterns of ceramic circuit boards. Such abnormal overheating inside a semiconductor device may cause a failure of the semiconductor device. This leads to a decrease in the reliability of the semiconductor device.

SUMMARY OF THE INVENTION

According to an aspect, there is provided a semiconductor device, including: a first conductive portion including a first conducting region and a first wiring region communicating with the first conducting region via a first communicating portion; a second conductive portion including a second conducting region and a second wiring region that communicates with the second conducting region via a second communicating portion and that faces the first wiring region with a prescribed space therebetween; and a wiring member electrically connecting the first wiring region and the second wiring region in a wiring direction, wherein the first communicating portion and the second communicating portion are separate from each other when viewed from the wiring direction.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
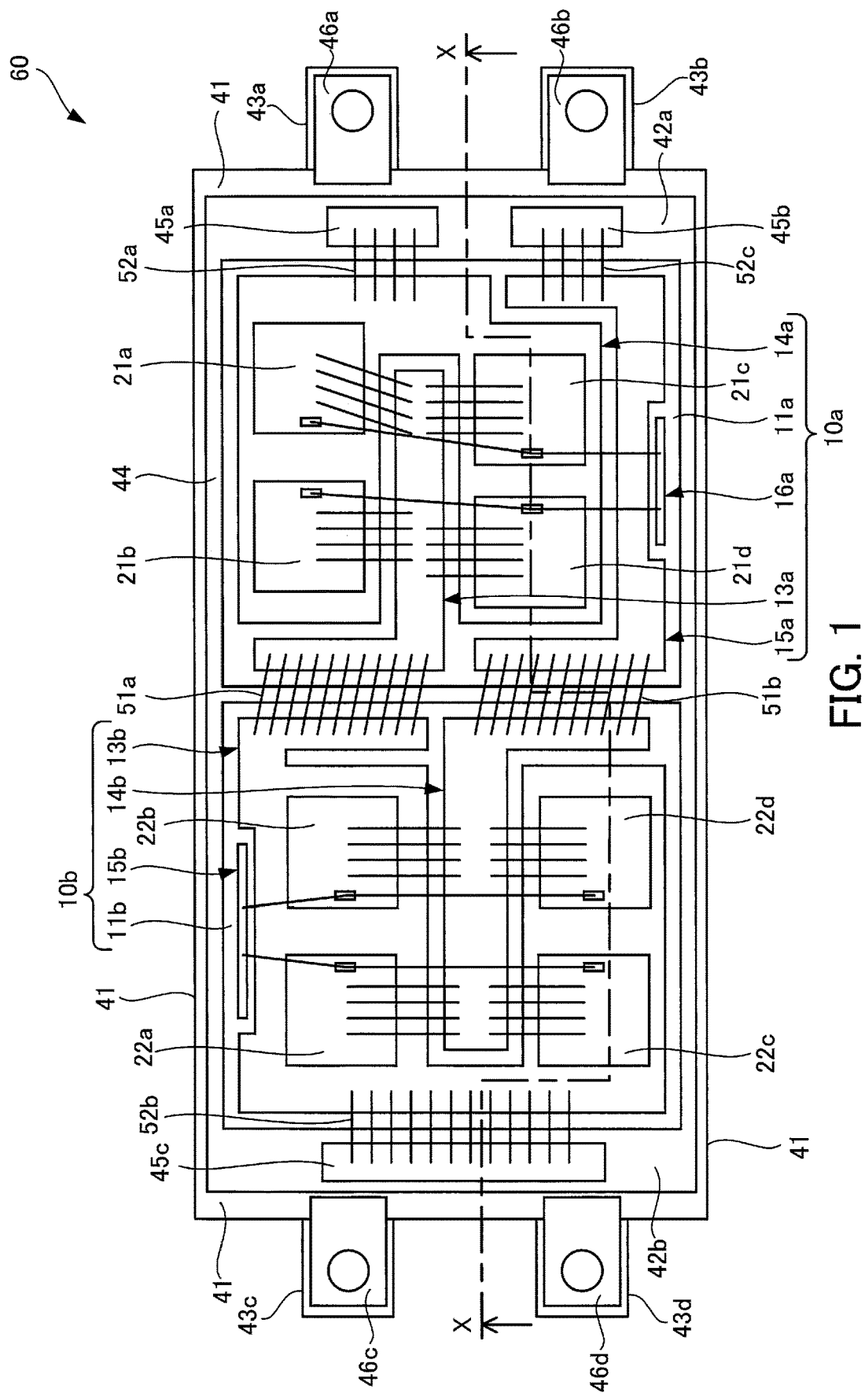
FIG. 1 is a plan view illustrating an example of a semiconductor device according to one embodiment.
Figure 2:
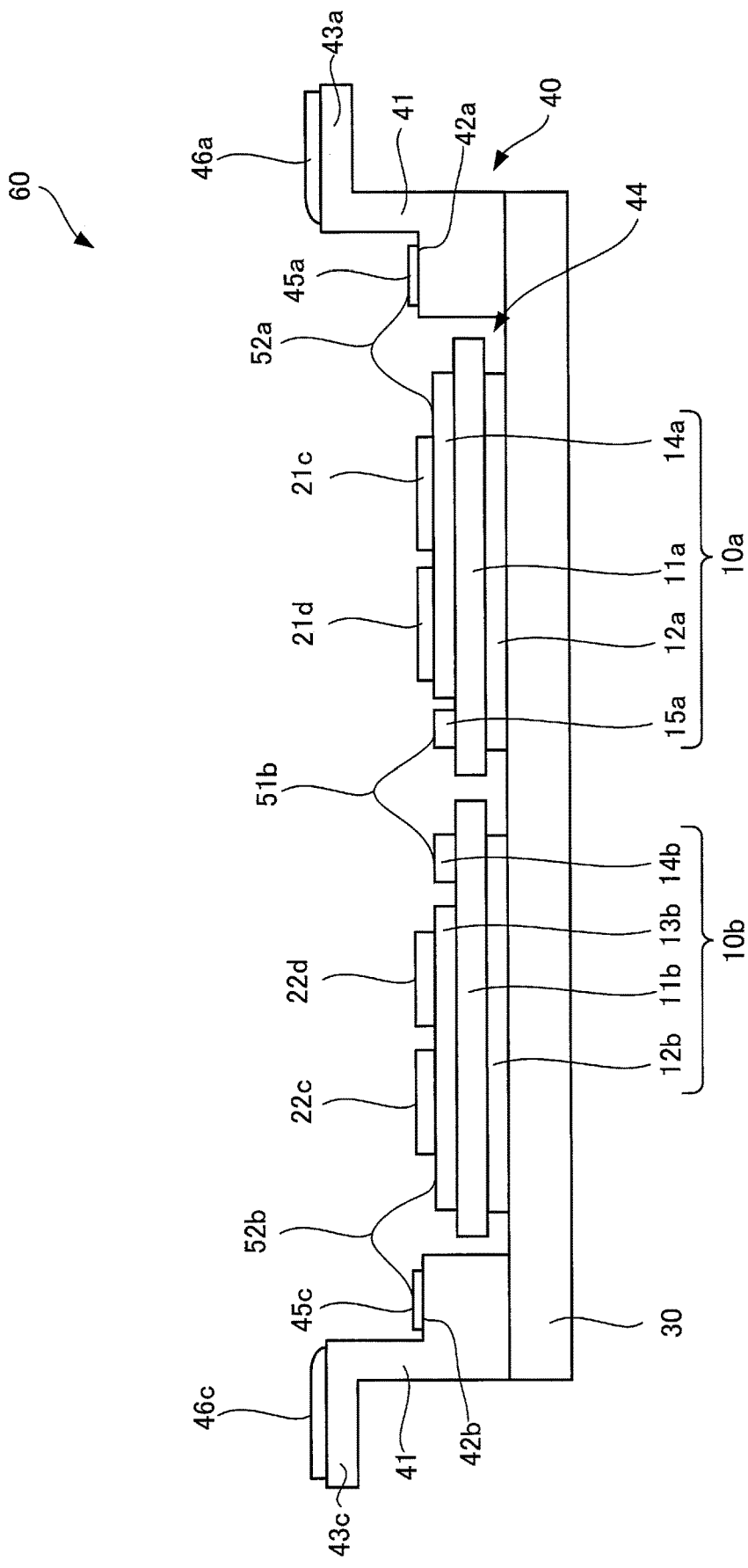
FIG. 2 is a sectional view illustrating the example of the semiconductor device according to the embodiment.

Hereinafter, a preferred embodiment will be described with reference to the accompanying drawings. A semiconductor device of this embodiment will be described with reference to FIGS. 1 and 2. FIG. 1 is a plan view illustrating an example of a semiconductor device according to the embodiment, and FIG. 2 is a sectional view illustrating the example of the semiconductor device according to the embodiment. In this connection, the sectional view of FIG. 2 is a view taken along the dot-dashed line X-X of FIG. 1. As illustrated in FIGS. 1 and 2, the semiconductor device 60 includes ceramic circuit boards 10a and 10b, and semiconductor elements 21a, 21b, 21c, and 21d and semiconductor elements 22a, 22b, 22c, and 22d respectively disposed on the front surfaces of the ceramic circuit boards 10a and 10b. In this connection, the ceramic circuit boards 10a and 10b are electrically connected to each other with wires 51a and 51b. In addition, the semiconductor device 60 includes a heat dissipation plate on which the ceramic circuit boards 10a and 10b are disposed via solder (not illustrated), and a case 40 that is disposed on the heat dissipation plate 30 so as to surround the ceramic circuit boards 10a and 10b. In this connection, the case 40 and the ceramic circuit boards 10a and 10b are electrically connected with wires 52a, 52b, and 52c.

In the illustrated semiconductor device 60, the connection between the ceramic circuit boards 10a and 10b and the connections between the ceramic circuit boards 10a and 10b and the case 40 are each made with a plurality of wires 51a, 51b, 52a, 52b, or 52c, by way of example. Alternatively, in the semiconductor device 60, these connections may be made with any other type of wiring member having electrical conductivity, in place of the plurality of wires 51a, 51b, 52a, 52b, and 52c. The wiring member has two or more joining parts and are electrically conductive between these joining parts. Each joining part is connected to one of the ceramic circuit boards 10a and 10b and the case 40, directly or via a joining member such as solder. In addition, the wiring member has a non-joining part between the joining parts, which does not contact with any of the ceramic circuit boards 10a and 10b and the case 40. Plate lead frames or ribbon cables may be used as the wiring members.

The semiconductor elements 21a, 21b, 21c, 21d, 22a, 22b, 22c, and 22d are switching elements made of silicon or silicon carbide. The switching elements may be IGBTs, power MOSFETs, or others, for example. Such semiconductor elements 21a, 21b, 21c, 21d, 22a, 22b, 22c, and 22d each have an input electrode (drain electrode or collector electrode) as a main electrode on its rear surface and a control electrode (gate electrode) and an output electrode (source electrode or emitter electrode) as main electrodes on its front surface, for example. In addition, the semiconductor elements 21a, 21b, 21c, 21d, 22a, 22b, 22c, and 22d include a diode such as an SBD (Schottky barrier diode) or an FWD as needed. Such semiconductor elements 21a, 21b, 21c, 21d, 22a, 22b, 22c, and 22d each have an output electrode (cathode electrode) as a main electrode on its rear surface and an input electrode (anode electrode) as a main electrode on its front surface. In addition, the semiconductor elements 21a, 21b, 21c, 21d, 22a, 22b, 22c, and 22d may include an RC (Reverse Conducting)-IGBT, which is a single element formed of an IGBT and an FWD. This embodiment describes the case of disposing only the semiconductor elements 21a, 21b, 21c, 21d, 22a, 22b, 22c, and 22d, by way of example. However, the configuration is not limited to this case, and electronic components may be disposed as needed. Examples of the electronic components include resistors, thermistors, capacitors, and surge absorbers.

The ceramic circuit boards 10a and 10b have electrical insulating boards 11a and 11b and metal plates 12a and 12b disposed on the rear surfaces of the electrical insulating boards 11a and 11b, respectively. In addition, the ceramic circuit boards 10a and 10b include circuit patterns 13a, 14a, 15a, and 16a formed on the front surface of the electrical insulating board 11a and circuit patterns 13b, 14b, and 15b formed on the front surface of the electrical insulating board 11b, respectively. The electrical insulating boards 11a and 11b are made of ceramics with high thermal conductivity, such as aluminum oxide, aluminum nitride, or silicon nitride, which has excellent thermal conductivity. The metal plates 12a and 12b are made of metal such as aluminum, iron, silver, copper, or an alloy containing at least one of these, which has excellent thermal conductivity. The circuit patterns 13a, 14a, 15a and 16a and the circuit patterns 13b, 14b, and 15b are made of metal such as copper or a copper alloy, which has excellent electrical conductivity. In addition, the semiconductor elements 21a, 21b, 21c, and 21d and the semiconductor elements 22a, 22b, 22c, and 22d are disposed on the circuit patterns 14a and 13b, respectively. The circuit pattern 16a is electrically connected to the control electrodes of the semiconductor elements 21a, 21b, 21c, and 21d with wires (reference numerals omitted). The circuit pattern 15b is electrically connected to the control electrodes of the semiconductor elements 22a, 22b, 22c, and 22d with wires (reference numerals omitted). The circuit pattern 13a is electrically connected to the output electrodes of the semiconductor elements 21a, 21b, 21c, and 21d with wires (reference numerals omitted). The circuit pattern 14b is electrically connected to the output electrodes of the semiconductor elements 22a, 22b, 22c, and 22d with wires (reference numerals omitted). The quantity and shapes of the circuit patterns 13a, 14a, 15a, and 16a and the quantity and shapes of the circuit patterns 13b, 14b, and 15b are illustrated by way of example, and their quantities and shapes may desirably be determined. The circuit patterns 13a, 14a, 15a, and 16a and circuit patterns 13b, 14b, and 15b have a thickness ranging from 0.1 mm to 1 mm, inclusive. The circuit patterns 13a, 14a, 15a, and 16a and circuit patterns 13b, 14b, and 15b will be described in detail later. As the ceramic circuit boards 10a and 10b configured as above, DCB (direct copper bonding) substrates and AMB (active metal brazed) substrates may be used, for example. The ceramic circuit boards 10a and 10b are able to conduct heat generated by the semiconductor elements 21a, 21b, 21c, and 21d and semiconductor elements 22a, 22b, 22c, and 22d to the heat dissipation plate 30 via the circuit patterns 14a and 13b, electrical insulating boards 11a and 11b, and metal plates 12a and 12b.

The heat dissipation plate 30 is made of aluminum, iron, silver, copper, or an alloy containing at least one of these, which has high thermal conductivity, for example. In addition, to improve corrosion resistance, for example, plating may be performed on the surface of the heat dissipation plate 30 using a material such as nickel. Specific examples of the material include, other than nickel, a nickel-phosphorus alloy, a nickel-boron alloy, and others. In this connection, to improve heat dissipation, a cooling unit (not illustrated) may be attached to the rear surface of the heat dissipation plate 30 using solder, silver solder, or the like. The cooling unit in this case may be made of aluminum, iron, silver, copper, or an alloy containing at least one of these, which has high thermal conductivity, for example. As the cooling unit, a fin, a heat sink with a plurality of fins, or a cooling device employing water cooling may be used. The heat dissipation plate 30 may be formed integrally with such a cooling unit. In this case, the heat dissipation plate 30 is made of aluminum, iron, silver, copper, or an alloy containing at least one of these, which has high thermal conductivity, for example. In addition, in order to improve corrosion resistance, for example, plating using a material such as nickel may be performed on the surface of the heat dissipation plate 30 formed integrally with the cooling unit. Specific examples of the material include, other than nickel, a nickel-phosphorus alloy, a nickel-boron alloy, and others.

The case 40 has a box shape and has side walls 41 that surround all sides and define an installation space 44. The side walls 41 surrounding all sides include opposite side walls 41 that have step portions 42a and 42b protruding toward the installation space 44. In addition, the opposite side walls 41 where the step portions 42a and 42b are formed have terminal installation portions 43a, 43b, 43c, and 43d formed at the opening edges thereof. In addition, the case 40 has an internal terminal 45a disposed on the step portion 42a and an external terminal 46a disposed on the terminal installation portion 43a. The external terminal 46a is electrically connected to the internal terminal 45a inside the side wall 41. The case 40 has an internal terminal 45b disposed on the step portion 42a and an external terminal 46b disposed on the terminal installation portion 43b. The external terminal 46b is electrically connected to the internal terminal 45b inside the side wall 41. In addition, the case 40 has an internal terminal 45c disposed on the step portion 42b and external terminals 46c and 46d respectively disposed on the terminal installation portions 43c and 43d. The external terminals 46c and 46d are electrically connected to the internal terminal 45c inside the side wall 41. In addition, the internal terminal 45a and the circuit pattern 14a are electrically connected to each other with the wires 52a. The internal terminal 45b and the circuit pattern 15a are electrically connected to each other with the wires 52c. The internal terminal 45c and the circuit pattern 13b are electrically connected to each other with the wires 52b. In this configuration, a positive electrode is connected to the external terminal 46a and a negative electrode is connected to the external terminal 46b, so that the external terminals 46c and 46d are able to provide outputs. In this connection, control terminals that receive control signals are provided on side walls 41 of the case 40, although this is not illustrated. The control terminals are electrically connected to the circuit patterns 16a and 15b, respectively. For example, the case 40 configured as above is produced by injection molding using a thermoplastic resin. Examples of such resin include polyphenylene sulfide (PPS), polybutylene terephthalate (PBT) resin, polybutylene succinate (PBS) resin, polyamide (PA) resin, and acrylonitrile butadiene styrene (ABS) resin.

The installation space 44 within the above case is filled with a sealing member to seal the semiconductor elements 21a, 21b, 21c, and 21d, semiconductor elements 22a, 22b, 22c and 22d, wires 52a, 52b, and 52c, ceramic circuit boards 10a and 10b, and others disposed in the installation space 44, although this is not illustrated. For example, the sealing member is made of thermosetting resin, such as maleimide-modified epoxy resin, maleimide-modified phenolic resin, or maleimide resin. Alternatively, the sealing member may be made of silicone gel. In addition, the wires 51a, 51b, 52a, 52b, and 52c (and the wires with reference numerals omitted) used in the semiconductor device 60 are made of aluminum, copper, or an alloy containing at least one of these, which has high electrical conductivity. These wires preferably have a radius ranging from 100 μm to 1 mm, inclusive.

Figure 3:
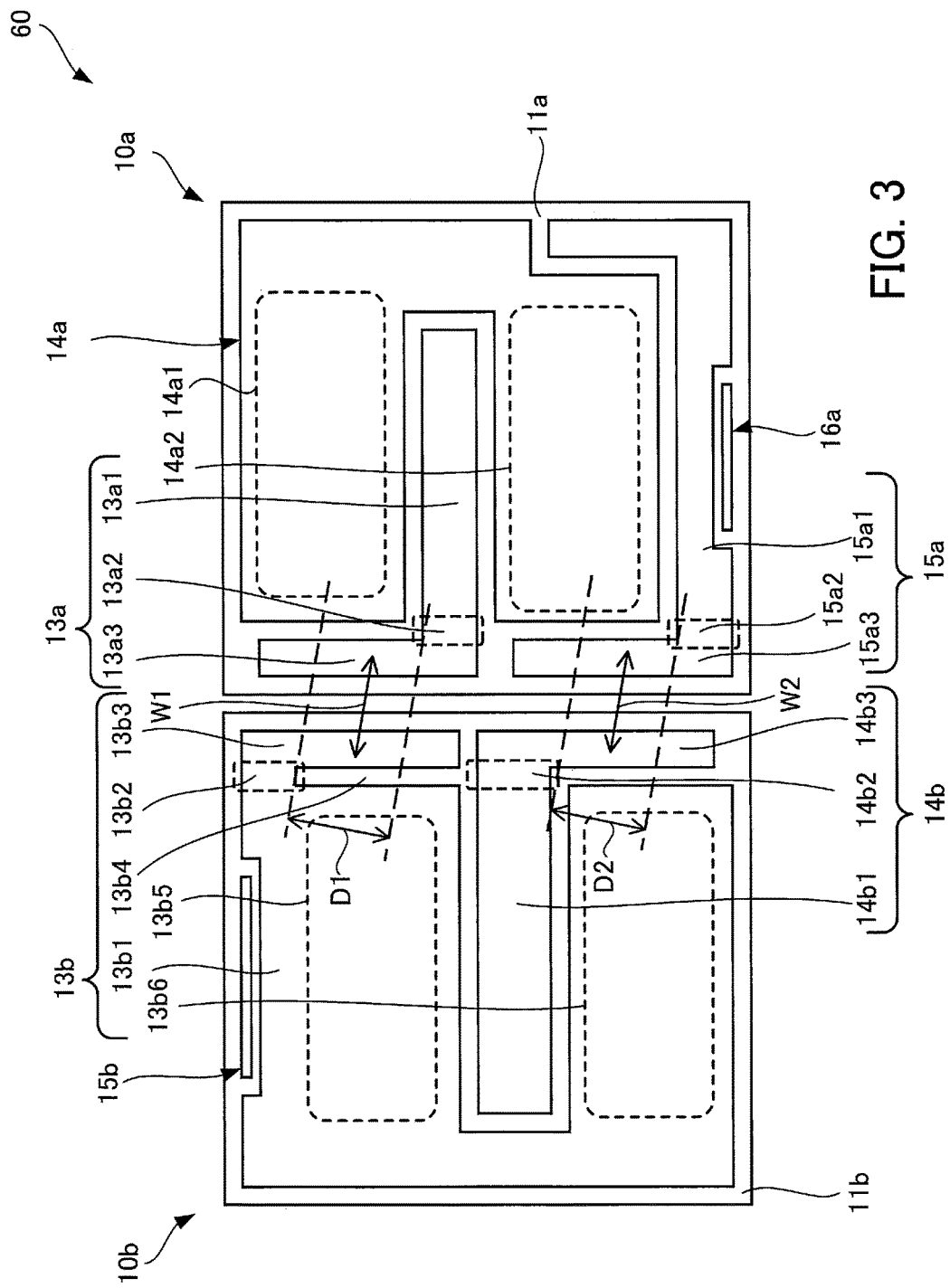
FIG. 3 is a plan view illustrating an example of ceramic circuit boards according to the embodiment.

The following describes the circuit patterns 13a, 14a, 15a, and 16a included in the ceramic circuit board 10a and the circuit patterns 13b, 14b, and 15b included in the ceramic circuit board 10b, with reference to FIG. 3. FIG. 3 is a plan view illustrating an example of the ceramic circuit boards according to the embodiment. In this connection, the ceramic circuit boards 10a and 10b illustrated in FIG. 3 are provided in the semiconductor device 60 illustrated in FIGS. 1 and 2, and the plan view of these is illustrated.

The ceramic circuit board 10a has the circuit patterns 13a, 14a, 15a, and 16a disposed on the electrical insulating board 11a, as described earlier. Especially, the circuit pattern 13a has a conducting region 13a1 and a wiring region 13a3 communicating with the conducting region 13a1 via a communicating portion 13a2 (illustrated by a broken line). The conducting region 13a1 is a region that is electrically connected to the semiconductor elements 21a, 21b, 21c, and 21d with wires (reference numeral omitted) and that allows current to flow from the semiconductor elements 21a, 21b, 21c, and 21d. The wiring region 13a3 is a region to which the wires 51a for allowing current to flow to the circuit pattern 13b are connected. In this connection, each of the conducting region 13a1, communicating portion 13a2, and wiring region 13a3 is of a stripe shape. More specifically, each of the conducting region 13a1 and wiring region 13a3 is of a stripe shape extending in a direction in which the conducting region 13a1 extends in the circuit pattern 13a. In the circuit pattern 13a, the wiring region 13a3 is wider than the conducting region 13a1 and extends in a direction perpendicular to the conducting region 13a1. In this connection, each of the conducting region 13a1 and wiring region 13a3 has a width in a direction perpendicular to a direction in which the conducting region 13a1 extends in the circuit pattern 13a. In addition, the circuit pattern 15a has a conducting region 15a1 and a wiring region 15a3 communicating with the conducting region 15a1 via a communicating portion 15a2 (illustrated by a broken line). In this connection, each of the conducting region 15a1, communicating portion 15a2, and wiring region 15a3 is of a stripe shape. More specifically, each of the conducting region 15a1 and wiring region 15a3 is of a stripe shape extending in a direction in which the conducting region 15a1 extends in the circuit pattern 15a. In the circuit pattern 15a, the wiring region 15a3 is wider than the conducting region 15a1 and extends in a direction perpendicular to the conducting region 15a1. In this connection, each of the conducting region 15a1 and wiring region 15a3 has a width in a direction perpendicular to a direction in which the conducting region 15a1 extends in the circuit pattern 15a. In addition, the circuit pattern 14a has element installation regions 14a1 and 14a2 on which the semiconductor elements 21a, 21b, 21c, and 21d are disposed.

The ceramic circuit board 10b has the circuit patterns 13b, 14b, and 15b disposed on the electrical insulating board 11b, as described earlier. Especially, the circuit pattern 13b has a conducting region 13b1 and a wiring region 13b3 that communicates with the conducting region 13b1 via a communicating portion 13b2 (illustrated by a broken line) and that faces the wiring region 13a3 with a prescribed space therebetween. The conducting region 13b1 is a region on which the semiconductor elements 22a, 22b, 22c, and 22d are disposed and which allows current to flow from the semiconductor elements 22a, 22b, 22c, and 22d. The wiring region 13b3 is a region to which the wires 51a for allowing current to flow from the different circuit pattern 13a are connected. In this connection, each of the conducting region 13b1, communicating portion 13b2, and wiring region 13b3 is of a stripe shape. More specifically, each of the conducting region 13b1 and wiring region 13b3 is of a stripe shape extending in a direction in which the conducting region 13b1 extends in the circuit pattern 13b. In the circuit pattern 13b, the wiring region 13b3 is wider than the communicating portion 13b2 and extends in a direction perpendicular to the communicating portion 13b2. That is, the conducting regions 13a1 and 13b1 extend in opposite directions with the wiring regions 13a3 and 13b3 therebetween. In this connection, each of the conducting region 13b1, communicating portion 13b2, and wiring region 13b3 has a width in a direction perpendicular to a direction in which the conducting region 13b1 extends in the circuit pattern 13b.

In addition, the circuit pattern 13b has a notch 13b4 formed beside the communicating portion 13b2. The notch 13b4 is formed at least at a portion where the communicating portion 13a2 and the conducting region 13b1 overlap in the circuit pattern 13b when viewed from the wiring direction W1 of the wires 51a. Furthermore, the notch 13b4 is formed to extend from a side portion on the opposite side to the extending direction of the wiring region 13a3 and to have a width longer than or equal to the width of the communicating portion 13a2 when viewed from the wiring direction W1 of the wires 51a. Here, the wiring direction W1 of the wires 51a refers to a direction passing through two connection points, a connection point of a wire 51a and the ceramic circuit board 10a and a connection point of the wire 51a and the ceramic circuit board 10b. In the case where the plurality of wires 51a have different wiring directions W1, their average direction is taken as the wiring direction. Likewise, with respect to the connections between the ceramic circuit boards 10a and 10b and the case 40 with the wires 52a and 52b, a direction passing through two connection points is taken as a wiring direction. In addition, in the case of using wiring members such as lead frames or ribbon cables, the average of directions each passing through two connection points is taken as a wiring direction. For example, in the case of FIG. 3, the notch 13b4 is formed so that the communicating portions 13a2 and 13b2 have an equal width. The conducting region 13b1 has element installation regions 13b5 and 13b6 on which the semiconductor elements 22a, 22b, 22c, and 22d are disposed. In addition, the circuit pattern 14b has a conducting region 14b1 and a wiring region 14b3 that communicates with the conducting region 14b1 via a communicating portion 14b2 (illustrated by a broken line) and that faces the wiring region 15a3 with a prescribed space therebetween. In this connection, each of the conducting region 14b1, communicating portion 14b2, and wiring region 14b3 is of a stripe shape. More specifically, each of the conducting region 14b1 and wiring region 14b3 is of a stripe shape extending in a direction in which the conducting region 14b1 extends in the circuit pattern 14b. In the circuit pattern 14b, the wiring region 14b3 is wider than the conducting region 14b1 and extends in a direction perpendicular to the conducting region 14b1. That is, the conducting regions 15a1 and 14b1 extend in opposite directions, with the wiring regions 15a3 and 14b3 therebetween. In this connection, each of the conducting region 14b1 and wiring region 14b3 has a width in a direction perpendicular to a direction in which the conducting region 14b1 extends in the circuit pattern 14b.

In this connection, external terminals may be electrically connected to the conducting regions 13a1 and 15a1 of the circuit patterns 13a and 15a of the ceramic circuit board 10a, as needed. Likewise, external terminals may be electrically connected to the conducting regions 13b1 and 14b1 of the circuit patterns 13b and 14b of the ceramic circuit board 10b, as needed.

In addition, as illustrated in FIG. 1, the wiring region 13a3 of the circuit pattern 13a and the wiring region 13b3 of the circuit pattern 13b are connected to each other with the wires 51a (not illustrated in FIG. 3) between the ceramic circuit boards 10a and 10b. In addition, the wiring region 15a3 of the circuit pattern 15a and the wiring region 14b3 of the circuit pattern 14b are connected to each other with the wires 51b (not illustrated in FIG. 3). In this case, the communicating portion 13a2 of the circuit pattern 13a and the communicating portion 13b2 of the circuit pattern 13b are separate from each other (by a distance D1) when viewed from the wiring direction W1 of the wires 51a. In addition, the communicating portion 15a2 of the circuit pattern 15a and the communicating portion 14b2 of the circuit pattern 14b are separate from each other (by a distance D2) when viewed from the wiring direction W2 of the wires 51b. The above describes an example where the wiring regions 13a3, 15a3, 13b3, and 14b3 are regions to which the wires 51a and 51b for allowing current to flow between the circuit patterns 13a, 13b, 14b, and 15a of the ceramic circuit boards 10a and 10b are connected. For example, the wiring regions may be used as regions to which, in addition to the above wires, the wires 52a, 52b, and 52c between the circuit patterns 14a, 15a, and 13b of the ceramic circuit boards 10a and 10b and the internal terminals 45a, 45b, and 45c of the case 40 are connected. In addition, the wires 51a, 51b, 52a, 52b and 52c may be wiring members, and lead frames or ribbon cables may be used as these wires, for example.

Figure 4:
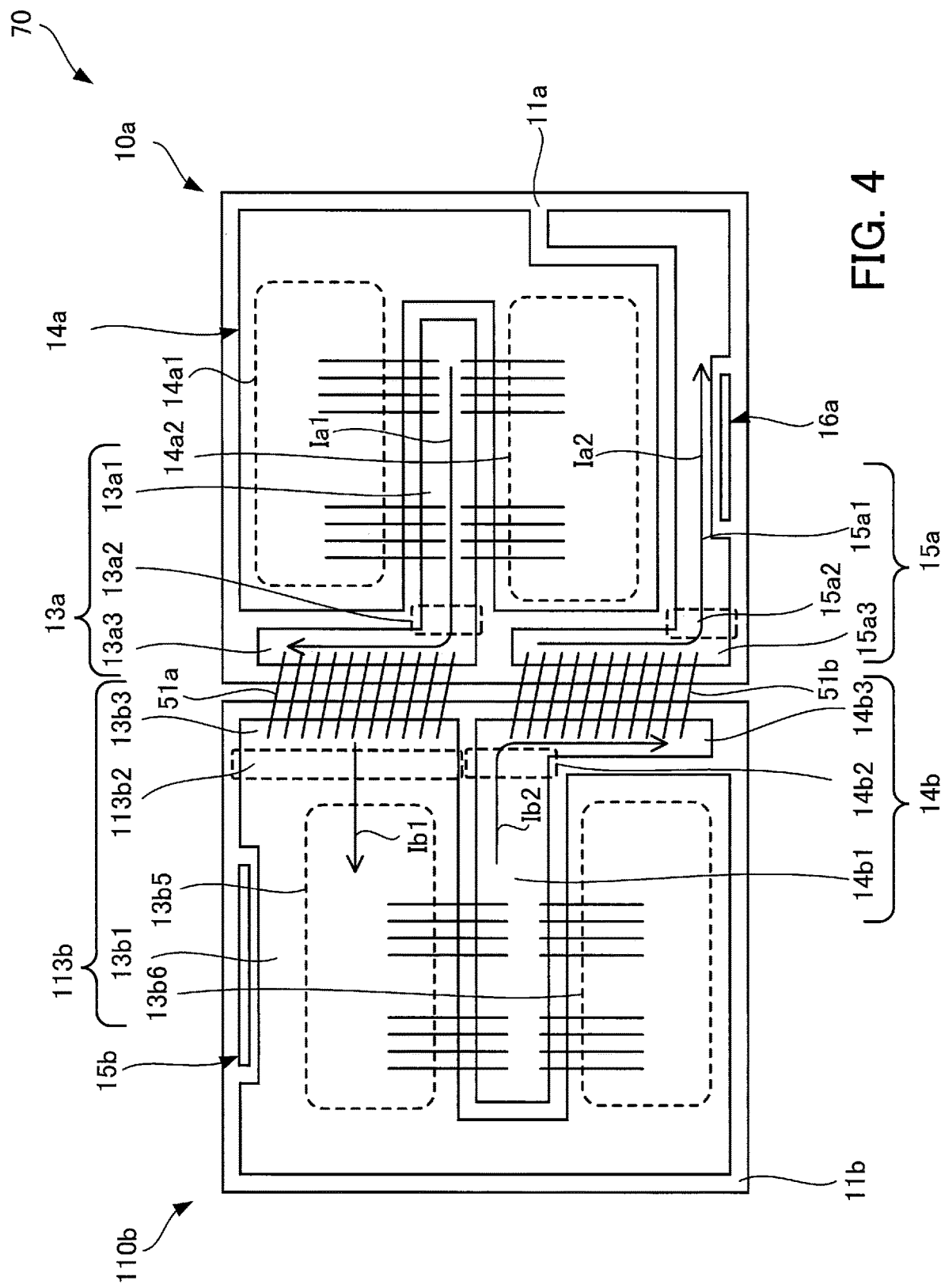
FIG. 4 is a plan view illustrating a sample of ceramic circuit boards according to a reference example.

Measurement is carried out to obtain a surface temperature distribution at the time when a current is made to flow in the ceramic circuit boards 10a and 10b electrically connected to each other with the wires 51a and 51b as described above. In this connection, a plurality of samples are prepared for the measurement. First, the following describes a sample that is a reference example for comparison with reference to FIG. 4. FIG. 4 is a plan view illustrating a sample of ceramic circuit boards according to the reference example. In this connection, the same reference numerals as used in the semiconductor device 60 are given to corresponding parts of the sample 70 of the reference example of FIG. 4. In this reference example, a circuit pattern 113b of a ceramic circuit board 110b has a conducting region 13b1 and a wiring region 13b3 communicating with the conducting region 13b1 via a communicating portion 113b2 (indicated by a broken line). Note that, unlike the communicating portion 13b2, the communicating portion 113b2 does not have the notch 13b4.

In addition, a wiring region 13a3 of a circuit pattern 13a and the wiring region 13b3 of the circuit pattern 113b are electrically connected to each other with wires 51a. A wiring region 15a3 of a circuit pattern 15a and a wiring region 14b3 of a circuit pattern 14b are electrically connected to each other with wires 51b. In addition, element installation regions 14a1 and 14a2 of a circuit pattern 14a and a conducting region 13a1 of the circuit pattern 13a are electrically connected with wires (reference numeral omitted). In addition, element installation regions 13b5 and 13b6 of the circuit pattern 113b and a conducting region 14b1 of the circuit pattern 14b are electrically connected with wires (reference numeral omitted).

In the sample 70 configured as above, a 1000 A current is made to flow from the circuit patterns 14a and 15a (regions thereof to which the wires 52a and 52c are connected (FIG. 1)) of the ceramic circuit board 10a. Then, the current is made to output from the circuit pattern 113b (portion corresponding to a region to which the wires 52b of the circuit pattern 13b of FIG. 1 are connected) of the ceramic circuit board 110b. The surface temperature distribution in the circuit patterns 13a and 113b and wires 51a when the current is made to flow in this way is analyzed. In addition, in this sample 70, the current input to the circuit pattern 14a flows to the wires 51a through a current conducting path Ia1 in the circuit pattern 13a. Then, the current from the wires 51a flows through a current conducting path Ib1 in the circuit pattern 113b. In addition, the current input to the circuit pattern 14b flows to the wires 51b through a current conducting path Ib2 in the circuit pattern 14b. Then, the current from the wires 51b flows through a current conducting path Ia2 in the circuit pattern 15a.

Figure 5:
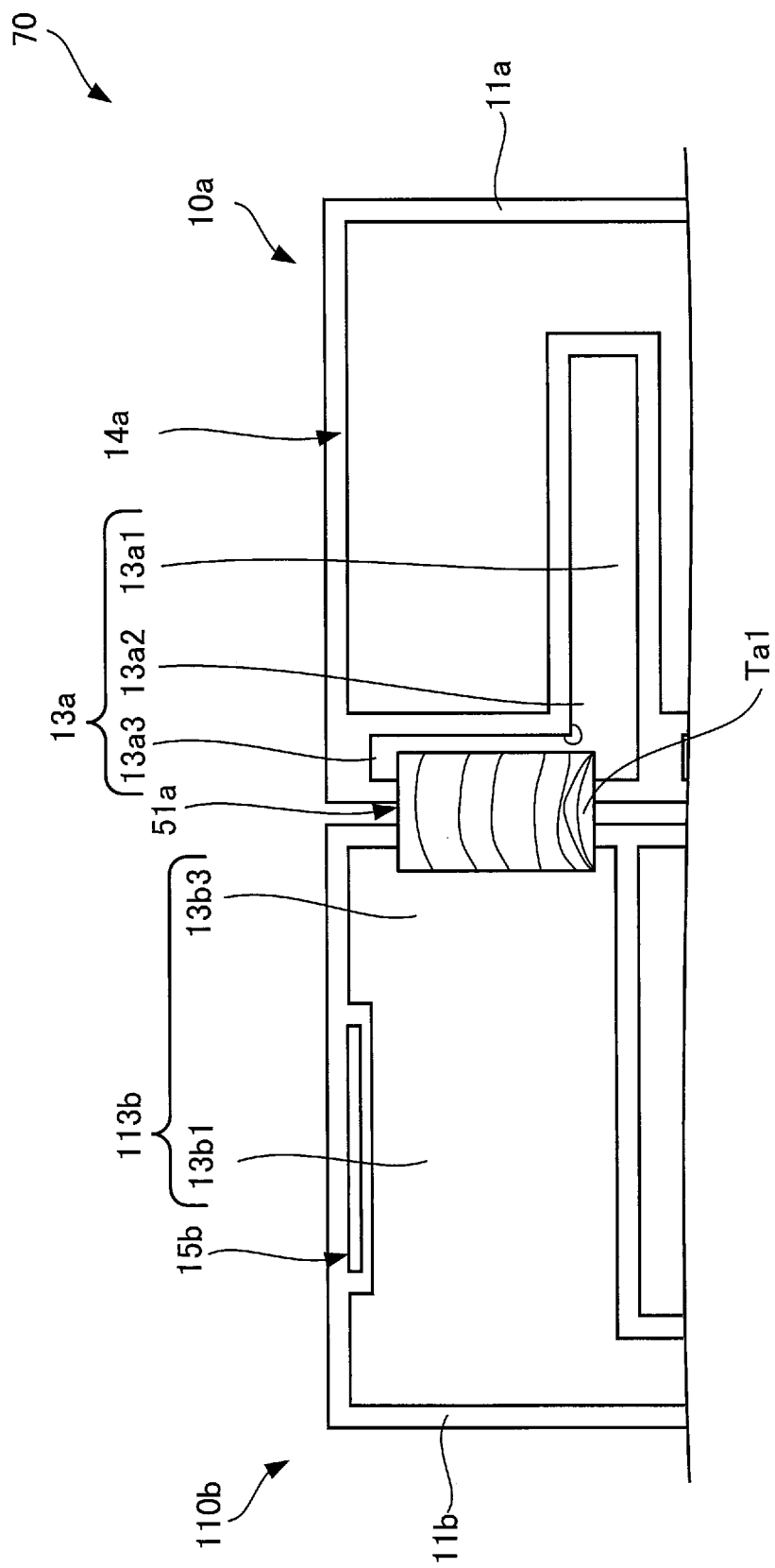
FIG. 5 illustrates an increased temperature distribution on the surface of a main part of the sample of the ceramic circuit boards according to the reference example.

The following describes, with reference to FIG. 5, an increased temperature distribution that is observed in the circuit patterns 13a and 113b and wires 51a when the current is made to flow in the sample 70. In this connection, the increased temperature is calculated by subtracting a temperature measured when the current does not flow in the sample 70 from a temperature measured when the current flows in the sample 70. FIG. 5 illustrates an increased temperature distribution on the surface of a main part of the sample of the ceramic circuit boards according to the reference example. In this connection, FIG. 5 illustrates a result of analyzing the increased temperature with respect to the circuit patterns 13a and 113b and wires 51a to be measured. In addition, the isolines in FIG. 5 represent an increased temperature distribution. In this connection, the wires 51a are illustrated by a rectangle for convenience to represent the increased temperature distribution.

As seen in the surface temperature distribution of FIG. 5, an isoline area Ta1 (lower part in FIG. 5) of the wires 51a closer to the communicating portion 13a2 has the maximum increase in temperature (110° C.). In addition, an increase in the temperature of an area decreases as the area gets farther from the area Ta1. The reason is as follows. As explained with reference to FIG. 4, current flows through the current conducting path Ia1 in the circuit pattern 13a. That is, when the current flows from the conducting region 13a1 via the communicating portion 13a2 to the wiring region 13a3, the current turns its flowing direction by 90 degrees and then flows to the wiring region 13a3 (upward in FIG. 5). Therefore, it appears that the circuit pattern 13a has high temperature at the inner side of the turn. Then, the current flows from the wiring region 13a3 to the wires 51a. Then, the current from the wires 51a flows through the current conducting path Ib1 in the circuit pattern 113b. That is, the current conducting path from the conducting region 13a1 via the wires 51a to the conducting region 13b1 has a shorter current conducting path at the lower part than at the upper part in FIG. 5. Therefore, with respect to the wires 51a, more current flows at the lower part than at the upper part in FIG. 5. It is also considered that, with respect to the conducting region 13b1 of the circuit pattern 113b, more current flows and the temperature is higher at the lower part in FIG. 5.

Since the circuit patterns 13a and 113b where the current flows are asymmetrical, the current conducting paths Ia1 and Ib1 through which the current flows in the circuit patterns 13a and 113b are asymmetrical accordingly. Therefore, uneven heating occurs in the wires 51a. The surface temperature distribution and others with respect to the circuit patterns 15a and 14b and the wires 51b will be described later. A prescribed current was actually made to flow in such a sample 70 and the sample 70 was observed using a thermo-viewer. As a result, it was observed that the wires 51a had the highest temperature of 270° C., meaning that abnormal overheating occurred. That is, more current flows at the lower part than at the upper part in FIG. 5. In addition, the wires 51a are separate from the ceramic circuit boards 10a and 10b, other than their portions joined to the wiring regions 13a3 and 13b3, and are therefore hard to cool. For this reason, it is considered that abnormal overheating occurred in the area Ta1 of the wires 51a closer to the communicating portion 13a2. That is to say, the inventors have discovered that the variations in the length of the current conducting path due to the shapes of the circuit patterns 13a and 113b promote the abnormal overheating in the wiring member, i.e., the wires 51a. Especially, a concentration of current on a short current conducting path and a loss due to the resistances of the wiring members cause abnormal overheating.

Figure 6:
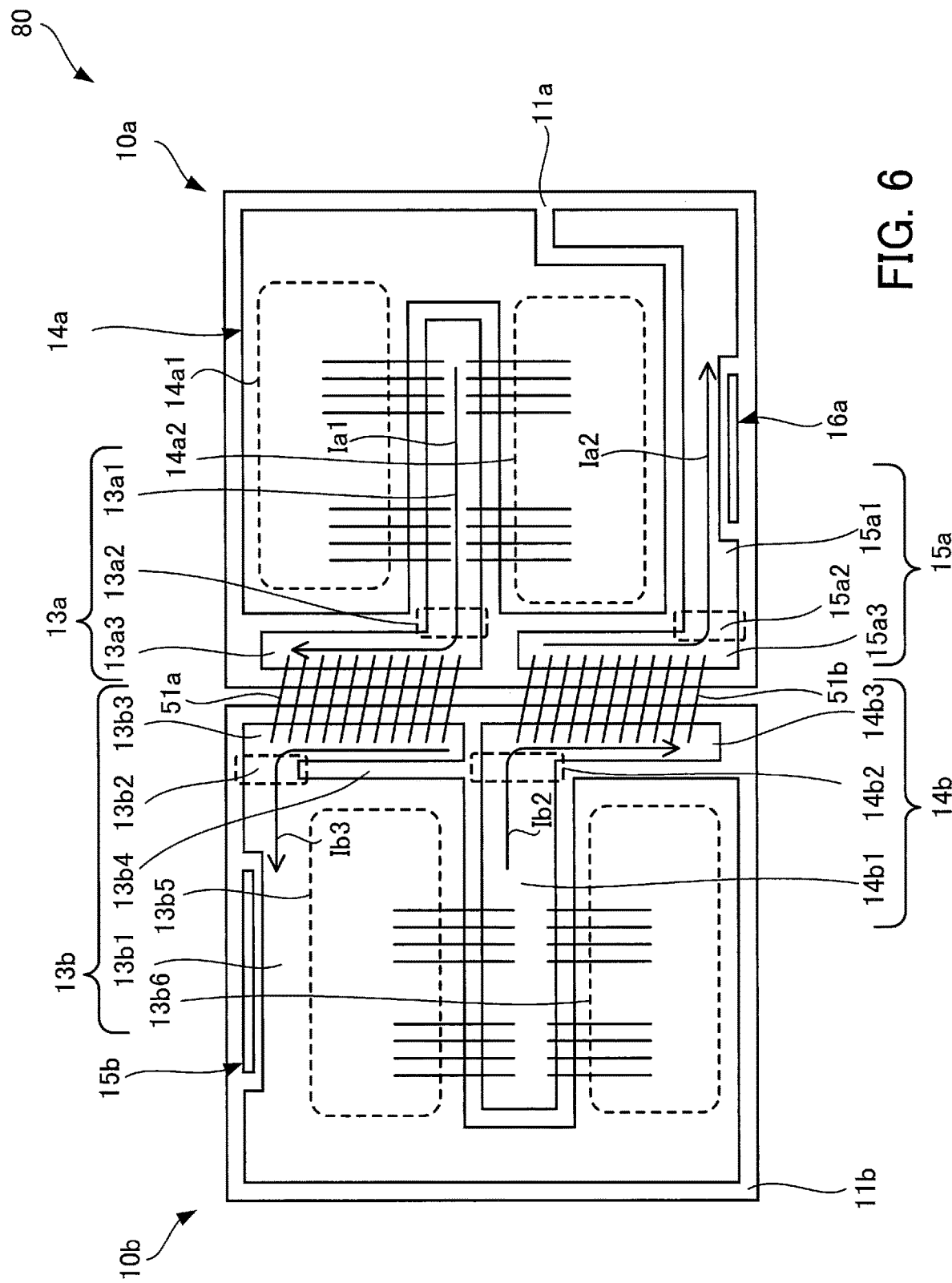
FIG. 6 is a plan view illustrating a sample of the ceramic circuit boards according to the embodiment.

The following describes a sample of the ceramic circuit boards 10a and 10b of the semiconductor device 60 with reference to FIG. 6. FIG. 6 is a plan view illustrating a sample of the ceramic circuit boards according to the embodiment. As illustrated in FIG. 6, the sample 80 of the ceramic circuit boards 10a and 10b of the semiconductor device 60 has a circuit pattern 13b, in place of the circuit pattern 113b of the sample 70. The circuit pattern 13b of the ceramic circuit board 10b has a conducting region 13b1 and a wiring region 13b3 communicating with the conducting region 13b1 via a communicating portion 13b2 having a notch 13b4. The other configuration and the analysis of surface temperature distribution are the same as those for the sample 70. In this sample 80, a current input to a circuit pattern 14a flows to wires 51a through a current conducting path Ia1 in a circuit pattern 13a. Because of the notch 13b4 formed in the circuit pattern 13b, the current from the wires 51a flows through a current conducting path Ib3, from the wiring region 13b3 via the communicating portion 13b2 to the conducting region 13b1, in the circuit pattern 13b. In addition, the current input to a circuit pattern 14b flows through a current conducting path Ib2 in the circuit pattern 14b to wires 51b. Then, the current from the wires 51b flows through a current conducting path Ia2 in a circuit pattern 15a.

Figure 7:
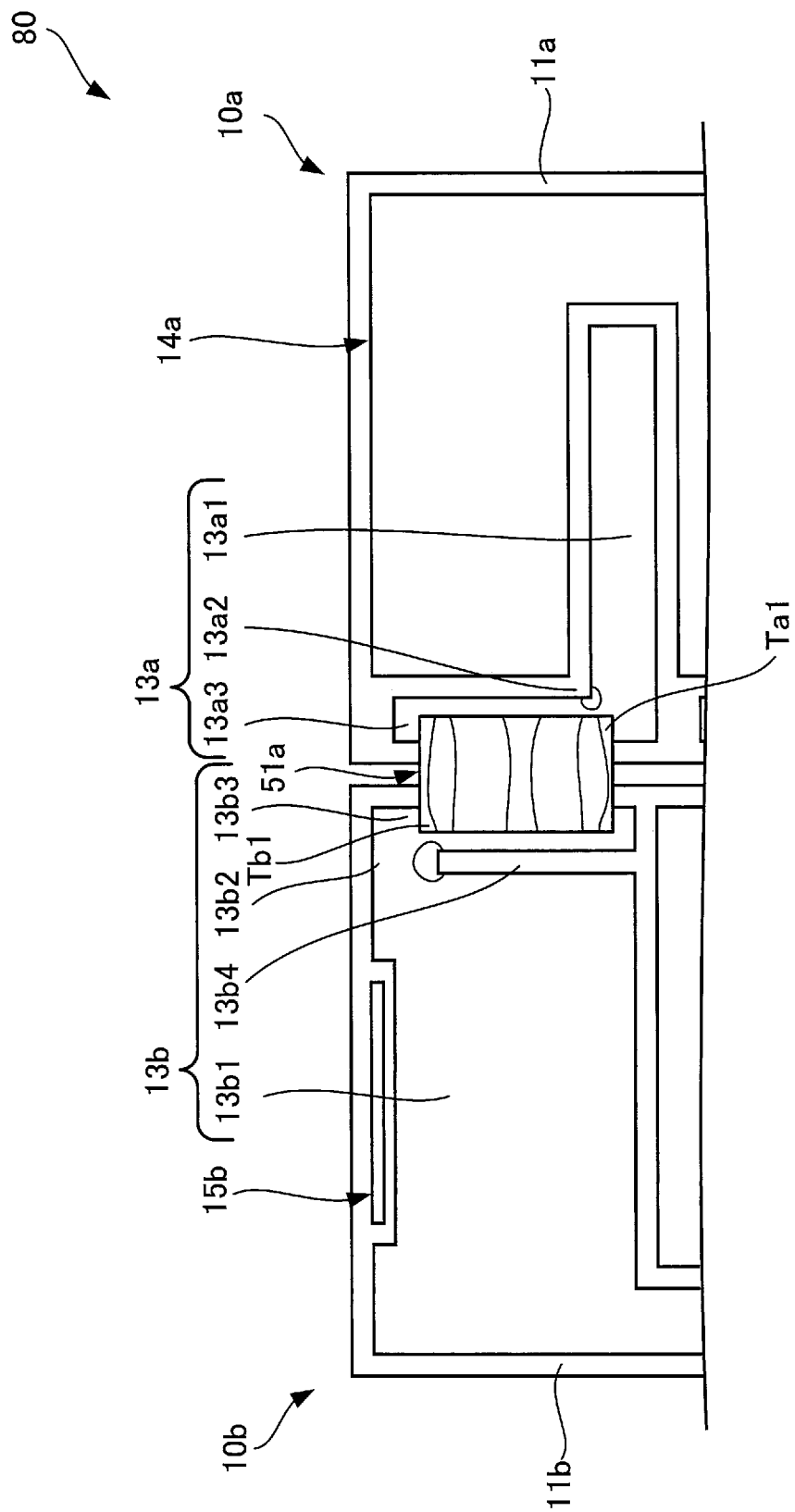
FIG. 7 illustrates an increased temperature distribution on the surface of a main part of the sample of the ceramic circuit boards according to the embodiment.

The following describes, with reference to FIG. 7, an increased temperature distribution that is observed in the circuit patterns 13a and 13b and wires 51a when a current is made to flow in the above sample 80. In this connection, the increased temperature is calculated by subtracting a temperature measured when the current does not flow in the sample 80 from a temperature measured when the current flows in the sample 80. FIG. 7 illustrates an increased temperature distribution on the surface of a main part of the sample of the ceramic circuit boards according to the embodiment. In this connection, FIG. 7 illustrates a result of analyzing the increased temperature with respect to the circuit patterns 13a and 13b and wires 51a to be measured. In addition, the isolines in FIG. 7 represent an increased temperature distribution. In this case as well, the wires 51a are illustrated by a rectangle for convenience to represent the increased temperature distribution.

As seen in FIG. 7, an isoline area Ta1 (lower part in FIG. 7) of the wires 51a closer to the communicating portion 13a2 and an isoline area Tb1 (upper part in FIG. 7) of the wires 51a closer to the communicating portion 13b2 have the same temperature and have the maximum increase in temperature (80° C.). In the wires 51a, an increase in the temperature in an area decreases as the area gets farther from the areas Ta1 and Tb1. In addition, variations in the increased temperature on the surface are small, compared with the case (sample 70) where the notch 13b4 is not formed.

In the circuit pattern 13b of the sample 80, the notch 13b4 is formed, so that the communicating portion 13b2 is formed. Therefore, the communicating portion 13a2 and the communicating portion 13b2 are separate from each other when viewed from the wiring direction of the wires 51a. That is, the current conducting path Ia1 in the circuit pattern 13a and the current conducting path Ib3 in the circuit pattern 13b are in point symmetry (with respect to the center of the wires 51a). Therefore, variations in the length of the current conducting path from the conducting region 13a1 to the conducting region 13b1 via the wires 51a are small, compared with the case (sample 70) where the notch 13b4 is not formed. Therefore, current smoothly and evenly flows in the wires 51a. This means that unevenness in the temperature of the wires 51a is reduced. A prescribed current was actually made to flow in such a sample 80 and the sample 80 was observed using a thermo-viewer. As a result, it was observed that the highest temperature was below 250° C., meaning that abnormal overheating did not occur. That is, the inventors have discovered that the separation between the communicating portion 13a2 and the communicating portion 13b2 when viewed from the wiring direction of the wires 51a contributes to reducing the variations in the length of the current conducting path due to the shapes of the circuit patterns 13a and 13b and allowing the current to flow evenly in the wiring member, i.e., the wires 51a, so as to prevent the occurrence of abnormal overheating.

The above-described analysis is not carried out for increased temperature on the surfaces of the circuit patterns 15a and 14b. However, the following consideration is made. The circuit patterns 15a and 14b are in point symmetry with respect to the center of the region of the wires 51b and the communicating portion 15a2 and the communicating portion 14b2 are separate from each other when viewed from the wiring direction of the wires 51b. Therefore, as in the circuit patterns 13a and 13b, the current conducting paths Ia2 and Ib2 are symmetrical. That is, in this case as well, it is considered that variations in the length of the current conducting path from the conducting region 14b1 to the conducting region 15a1 via the wires 51b are small. Therefore, it is considered that unevenness in the temperature of the wires 51b is reduced. In the case of using silicone gel which has a heat resistance temperature of 250° C. to seal the case 40 of the semiconductor device 60, the temperature of the wires 51a and 51b that electrically connect the ceramic circuit boards 10a and 10b is controlled to be below 250° C. Therefore, a deterioration or the like of the silicone gel may be precluded, and a decrease in the reliability of the semiconductor device 60 may be prevented.

Figure 8:
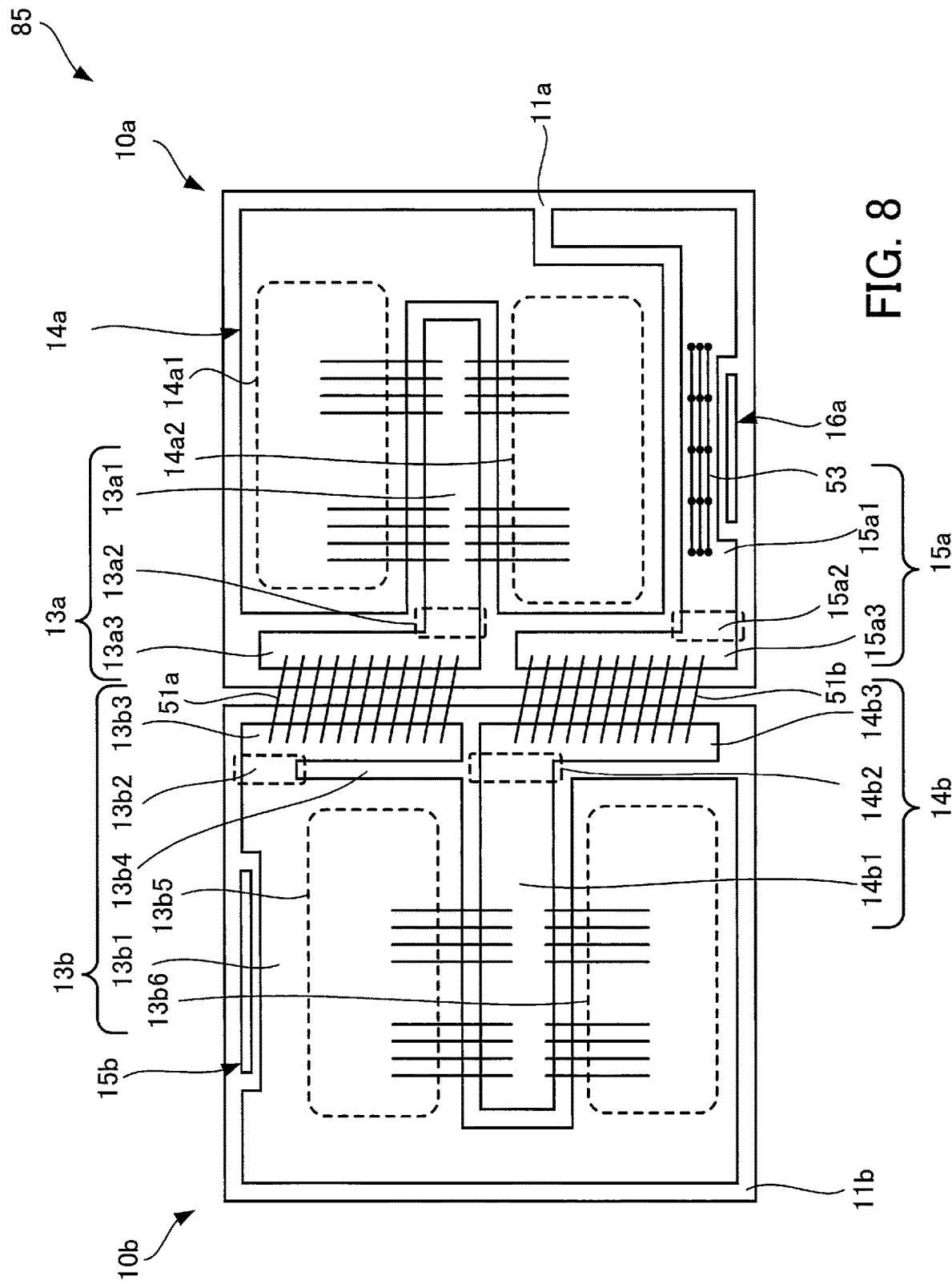
FIG. 8 is a plan view illustrating another sample of the ceramic circuit boards according to the embodiment.

The following describes, with reference to FIG. 8, a sample obtained by forming ground wires 53 in the conducting region 15a1 of the circuit pattern 15a of the sample 80. FIG. 8 is a plan view illustrating another sample of the ceramic circuit boards according to the embodiment. In this connection, the sample 85 of FIG. 8 has a plurality of ground wires 53 each electrically connecting at least two points on the surface of the conducting region 15a1 of the circuit pattern 15a of the sample 80. The other configuration and the analysis of surface temperature distribution are the same as those for the sample 80. In this connection, the sample 85 has the ground wires 53 formed in the conducting region 15a1 of the circuit pattern 15a, by way of example. The ground wires 53 are made of aluminum, copper, or an alloy containing at least one of these, which has high electrical conductivity. In addition, the ground wires 53 preferably have a radius ranging from 100 μm to 1 mm, inclusive. The ground wires 53 may be formed with a wire bonding apparatus. The ground wires 53 are not limited to the above configuration and may be formed to have a different configuration on a circuit pattern according to the shape and size of the circuit pattern.

This sample 85 has circuit patterns similar to those of the sample 80. Therefore, the sample 85 has an increased temperature distribution on the surface similar to that of the sample 80 illustrated in FIG. 7. The internal resistances of the samples 80 and 85 were measured with a tester. The internal resistance is a total electrical resistance in a region from the internal terminal 45a to the internal terminal 45b of the case 40 excluding the semiconductor elements 21a, 21b, 21c, and 21d and the semiconductor elements 22a, 22b, 22c, and 22d. As a result, the internal resistance of the sample 85 was 82% of that of the sample 80 illustrated in FIG. 6. This would be because the ground wires 53 are formed in the conducting region 15a1 of the circuit pattern 15a and this allows current to flow in the conducting region 15a1 and ground wires 53 and thus the internal resistance decreases. Since the internal resistance is reduced in this way, the sample 85 is superior to the sample 80 in terms of suppressing generation of heat by a current flowing in the semiconductor device 60 and preventing the decrease in the reliability of the semiconductor device 60.

Figure 9A:
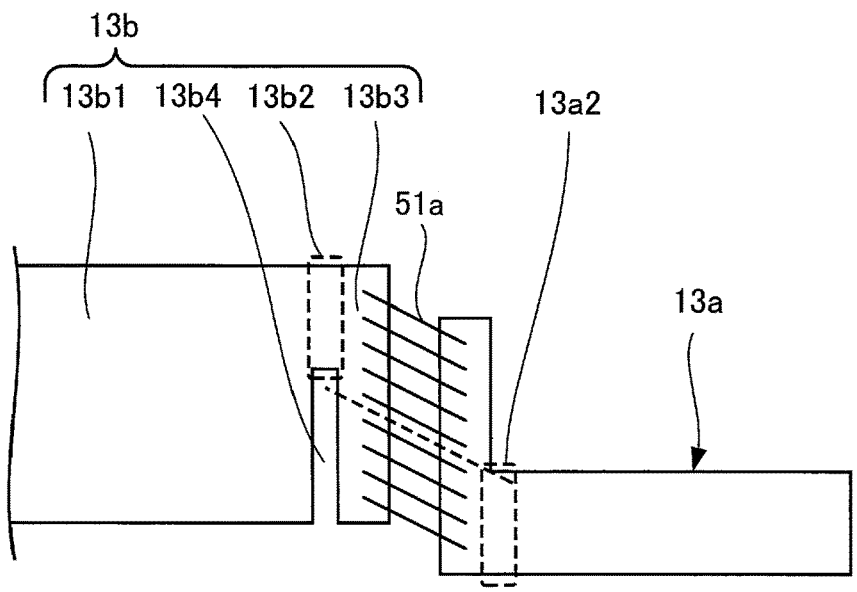
FIGS. 9A to 9C illustrate modification examples of circuit patterns of the ceramic circuit boards according to the embodiment (part 1)
Figure 9B:
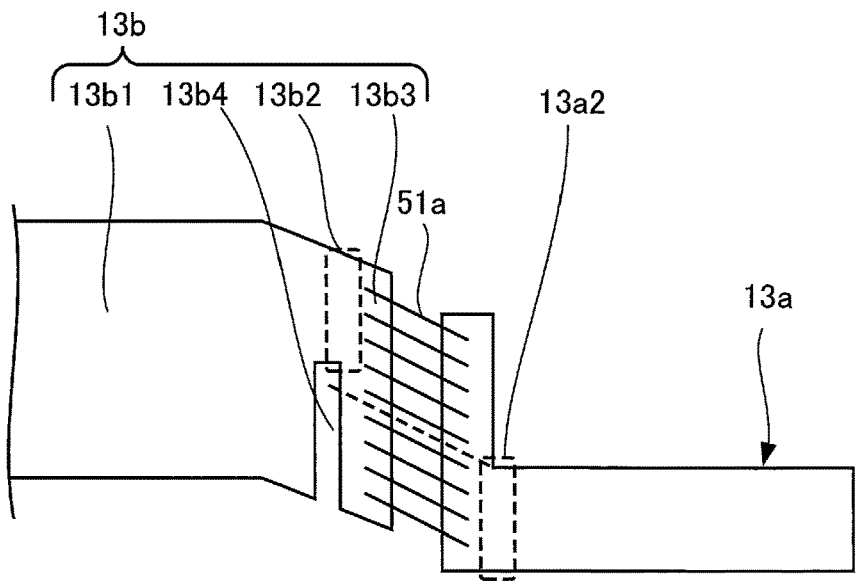
Figure 9C:
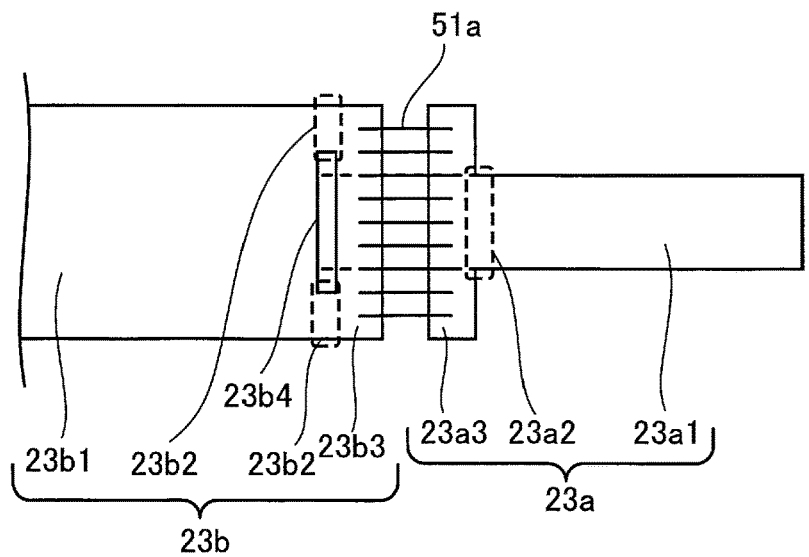
Figure 10A:
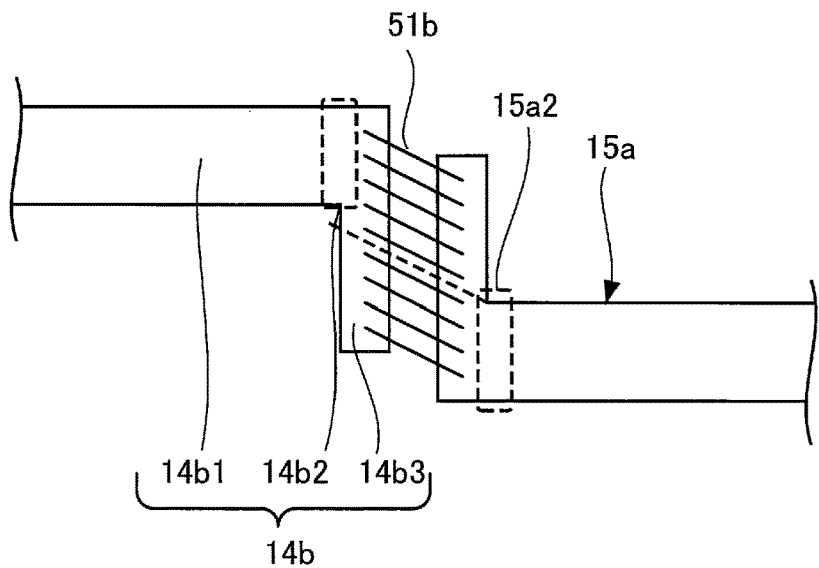
FIGS. 10A to 10C illustrate modification examples of the circuit patterns of the ceramic circuit boards according to the embodiment (part 2)
Figure 10B:
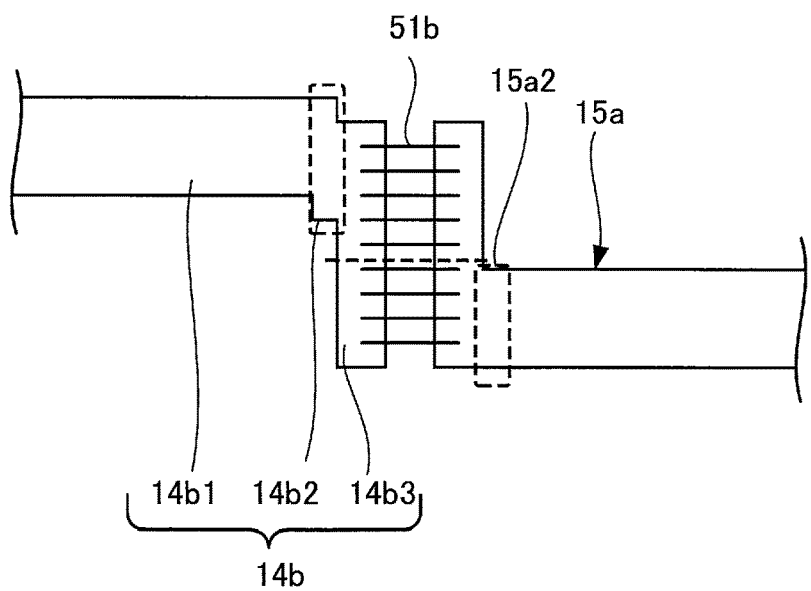
Figure 10C:
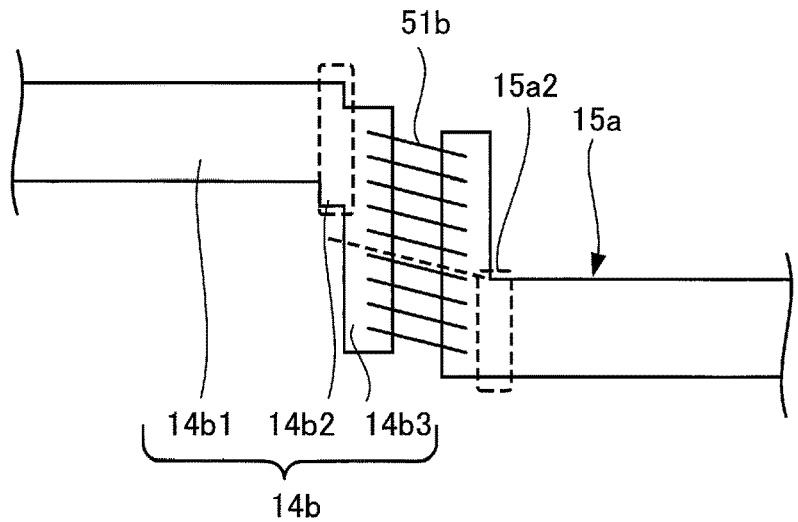

The following describes, with reference to FIGS. 9A to 9C and 10A to 10C, modification examples of the circuit patterns that are able to reduce unevenness of heating caused by a current flow as illustrated in FIG. 6. FIGS. 9A to 9C and 10A to 10C illustrate modification examples of the circuit patterns of the ceramic circuit boards according to the embodiment. In this connection, FIGS. 9A to 9C illustrate a case where a notch is formed to allow a pair of circuit patterns to have symmetrical current conducting paths (namely, circuit patterns 13a and 13b). FIGS. 10A to 10C illustrate a case where a pair of circuit patterns are formed to have shapes so as to have symmetrical current conducting paths (namely, circuit patterns 15a and 14b). The same reference numerals as used in the semiconductor device 60 are applied to the corresponding components in FIGS. 9A to 9C and 10A to 10C. FIG. 9A illustrates a case where the circuit pattern 13b is displaced upward in FIG. 6. FIG. 9B illustrates a case where the conducting region 13b1, communicating portion 13b2, and wiring region 13b3 are inclined to be parallel to the wiring direction of the wires 51a in FIG. 9A. Referring to FIG. 9C, circuit patterns 23a and 23b are electrically connected to each other with wires 51a. The circuit pattern 23a has a conducting region 23a1 and a wiring region 23a3 communicating with the conducting region 23a1 at the center thereof via a communicating portion 23a2. The circuit pattern 23b has a conducting region 23b1 and a wiring region 23b3 communicating with the conducting region 23b1 via a pair of communicating portions 23b2 with a notch 23b4 formed at the center therebetween. FIG. 10A illustrates a case where the circuit pattern 14b is displaced upward in FIG. 6. FIG. 10B illustrates a case where only the conducting region 14b1 of the circuit pattern 14b is displaced upward in FIG. 6. FIG. 10C illustrates a case where the circuit pattern 14b is displaced upward in FIG. 10B.

In both FIG. 9A and FIG. 9B, the formation of the notch 13b4 described above allows the communicating portion 13a2 of the circuit pattern 13a and the communicating portion 13b2 of the circuit pattern 13b to be separate from each other when viewed from the wiring direction of the wires 51a. In addition, in FIG. 9C as well, the formation of the notch 23b4 allows the communicating portion 23a2 of the circuit pattern 23a and the communicating portions 23b2 of the circuit pattern 23b to be separate from each other when viewed from the wiring direction of the wires 51a. In all the cases illustrated in FIGS. 10A to 10C as well, the communicating portion 15a2 of the circuit pattern 15a and the communicating portion 14b2 of the circuit pattern 14b are separate from each other when viewed from the wiring direction of the wires 51b. Therefore, the current conducting paths in the circuit patterns 13a and 15a and the circuit patterns 13b and 14b are in point symmetry with respect to the centers of the wires 51a and 51b, respectively. In addition, the current conducting paths in the circuit pattern 23a and the circuit pattern 23b are in line symmetry with respect to the wiring direction of the wires 51a. Therefore, unevenness of heating in the circuit patterns 13a, 23a, and 15a and circuit patterns 13b, 23b, and 14b is reduced and the internal resistance is reduced. As a result, an increase in the temperature of the wires 51a and 51b is controlled.

Figure 11:
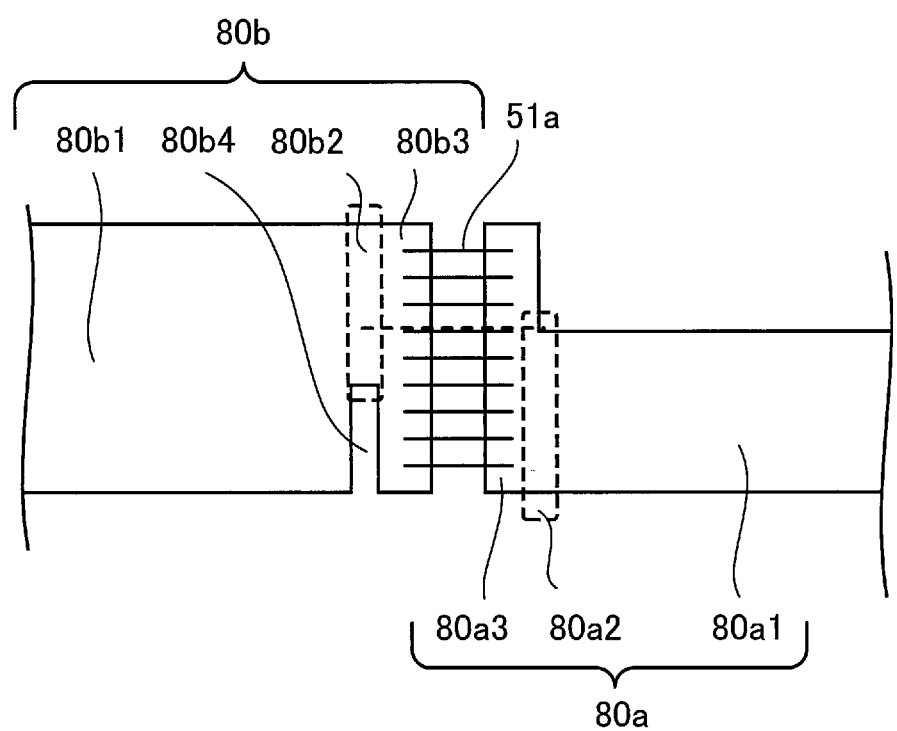
FIG. 11 illustrates a modification example of circuit patterns of the ceramic circuit boards according to the reference example (part 1)
Figure 12A:
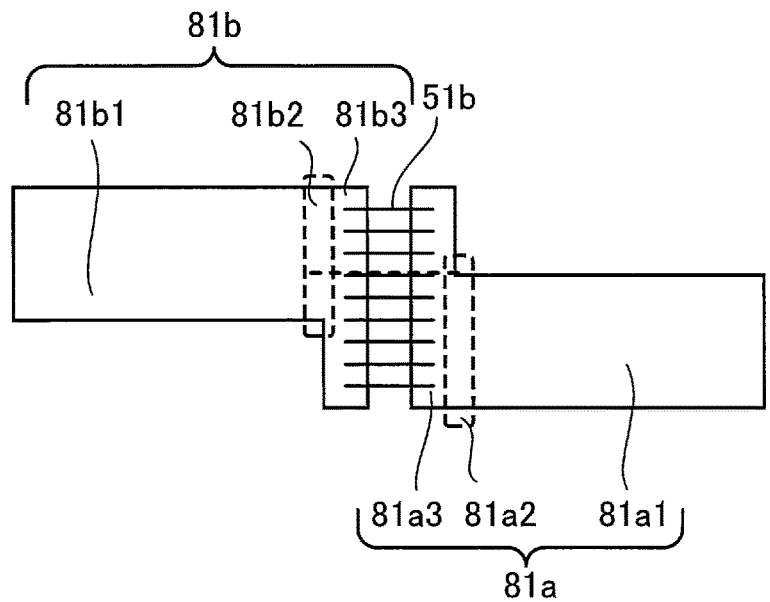
FIGS. 12A to 12C illustrate modification examples of the circuit patterns of the ceramic circuit boards according to the reference example (part 2).
Figure 12B:
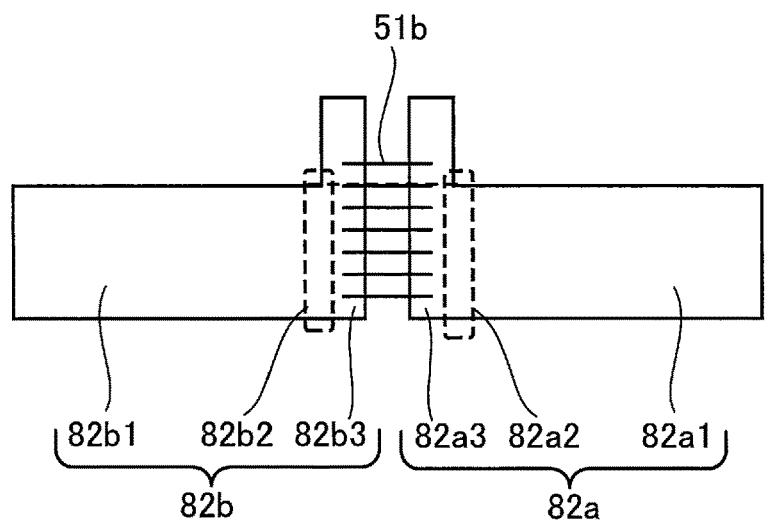
Figure 12C:
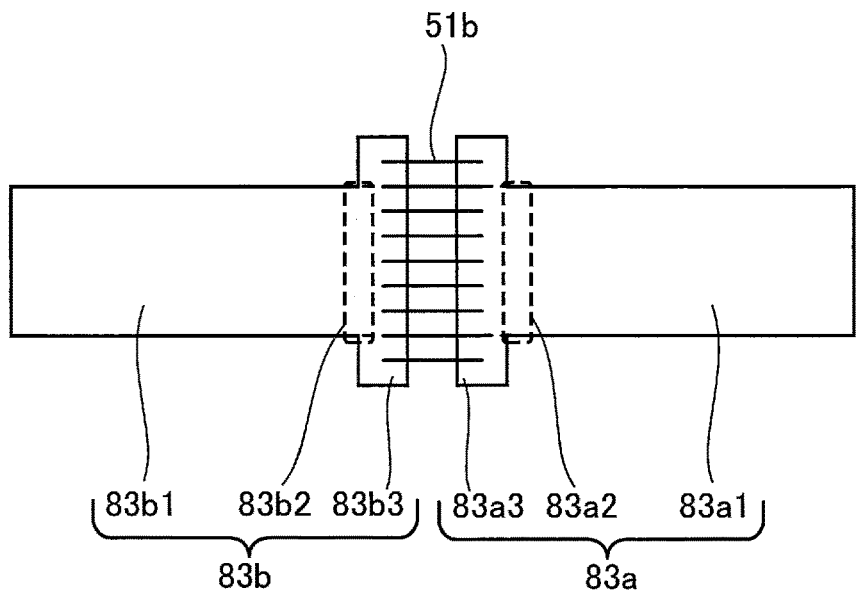

The following describes, with reference to FIGS. and 12A to 12C, modification examples of the circuit patterns of the ceramic circuit boards according to the reference example. FIGS. 11 and 12A to 12C illustrate the modification examples of the circuit patterns of the ceramic circuit boards according to the reference example. FIG. 11 illustrates a case where a notch is formed to allow a pair of circuit patterns to have symmetrical current conducting paths. FIGS. 12A to 12C illustrate a case where a pair of circuit patterns are formed to have shapes so as to have symmetrical current conducting paths. In addition, FIGS. 11 and 12A to 12C illustrate only the circuit patterns of the ceramic circuit boards.

Referring to FIG. 11, circuit patterns 80a and 80b are electrically connected to each other with wires 51a. The circuit pattern 80a has a conducting region 80a1 and a wiring region 80a3 communicating with the conducting region 80a1 via a communicating portion 80a2. The circuit pattern 80b has a conducting region 80b1 and a wiring region 80b3 communicating with the conducting region 80b1 via a communicating portion 80b2 formed by forming a notch 80b4. In the circuit pattern 80b, the notch 80b4 is shallow and the communicating portion 80a2 of the circuit pattern 80a and the communicating portion 80b2 of the circuit pattern 80b are not separate from each other but overlap when viewed from the wiring direction of the wires 51a. When a current is made to flow from the circuit pattern 80a to the circuit pattern 80b, the current conducting paths in the circuit patterns 80a and 80b are not symmetrical because the communicating portion 80a2 and the communicating portion 80b2 overlap when viewed from the wiring direction of the wires 51. Therefore, uneven heating occurs in the circuit patterns 80a and 80b and the internal resistance is not reduced, which may increase the temperature of the wires 51a.

In addition, referring to FIG. 12A, circuit patterns 81a and 81b are electrically connected to each other with wires 51b. The circuit pattern 81a has a conducting region 81a1 and a wiring region 81a3 communicating with the conducting region 81a1 via a communicating portion 81a2. The circuit pattern 81b has a conducting region 81b1 and a wiring region 81b3 communicating with the conducting region 81b1 via a communicating portion 81b2. In this case as well, the communicating portion 81a2 of the circuit pattern 81a and the communicating portion 81b2 of the circuit pattern 81b are not separate from each other but overlap when viewed from the wiring direction of the wires 51b. When a current is made to flow from the circuit pattern 81a to the circuit pattern 81b, the current conducting paths in the circuit patterns 81a and 81b are not symmetrical because the communicating portion 81a2 and the communicating portion 81b2 overlap when viewed from the wiring direction of the wires 51b. Therefore, uneven heating occurs in the circuit patterns 81a and 81b and the internal resistance is not reduced, which may increase the temperature of the wires 51b.

In addition, referring to FIG. 12B, circuit patterns 82a and 82b are electrically connected to each other with wires 51b. The circuit pattern 82a has a conducting region 82a1 and a wiring region 82a3 communicating with the conducting region 82a1 via a communicating portion 82a2. The circuit pattern 82b has a conducting region 82b1 and a wiring region 82b3 communicating with the conducting region 82b1 via the communicating portion 82b2. In this case as well, the communicating portion 82a2 of the circuit pattern 82a and the communicating portion 82b2 of the circuit pattern 82b are opposite to each other when viewed from the wiring direction of the wires 51b. For example, when a current is made to flow from the circuit pattern 82a to the circuit pattern 82b, the current flows from the conducting region 82a1 to the wiring region 82a3 and then to the wiring region 82b3 through the wires 51b. At this time, the temperature at the upper part of the communicating portion 82b2 in FIG. 12B may increase. That is, uneven heating occurs in the circuit patterns 82a and 82b and the internal resistance is not reduced, which may increase the temperature of the wires 51b.

Referring to FIG. 12C, circuit patterns 83a and 83b are electrically connected to each other with wires 51b. The circuit pattern 83a has a conducting region 83a1 and a wiring region 83a3 communicating with the conducting region 83a1 via a communicating portion 83a2. The circuit pattern 83b has a conducting region 83b1 and a wiring region 83b3 communicating with the conducting region 83b1 via a communicating portion 83b2. In this case as well, the communicating portion 83a2 of the circuit pattern 83a and the communicating portion 83b2 of the circuit pattern 83b are opposite to each other when viewed from the wiring direction of the wires 51b. For example, when a current is made to flow from the circuit pattern 83a to the circuit pattern 83b, the current flows (by splitting) from the conducting region 83a1 to the wiring region 83a3 and then to the wiring region 83b3 through the wires 51b. At this time, the temperature at the both ends (upper and lower parts in FIG. 12C) of the communicating portion 83b2 may increase. That is, uneven heating occurs in the circuit patterns 83a and 83b and the internal resistance is not reduced, which may increase the temperature of the wires 51b.

The above-described semiconductor device 60 has the circuit patterns 13a and 15a that include the conducting regions 13a1 and 15a1 and the wiring regions 13a3 and 15a3 communicating with the conducting regions 13a1 and 15a1 via the communicating portions 13a2 and 15a2, respectively. In addition, the semiconductor device 60 has the circuit patterns 13b and 14b that include the conducting regions 13b1 and 14b1 and the wiring regions 13b3 and 14b3 that communicate with the conducting regions 13b1 and 14b1 via the communicating portions 13b2 and 14b2 and that face the wiring regions 13a3 and 15a3 with a prescribed space therebetween, respectively. The semiconductor device 60 also has the wires 51a and 51b electrically connecting the wiring regions 13a3 and 15a3 and the wiring regions 13b3 and 14b3. In this case, the communicating portions 13a2 and 15a2 and the communicating portions 13b2 and 14b2 are separate from each other when viewed from the wiring direction of the wires 51a and 51b, respectively. Therefore, the current conducting paths in the circuit patterns 13a and 15a and the current conducting paths in the circuit patterns 13b and 14b are in point symmetry (with respect to the centers of the wires 51a and 51b), respectively. Therefore, unevenness in the current flow in the wires 51a and 51b is reduced and thus an increase in the temperature of the wires 51a and 51b is controlled. As a result, the semiconductor device 60 is able to prevent the occurrence of damage due to heating and prevent a decrease in reliability. In this connection, this embodiment controls the current conducting paths in the circuit patterns 13a and 13b and the circuit patterns 15a and 14b in the semiconductor device 60 in order to control an increase in the temperature of the wires 51a and 51b. The configuration is not limited to the circuit patterns 13a and 13b and the circuit patterns 15a and 14b. For example, even in the case of electrically connecting a pair of conductive portions such as lead frames with a wiring member, the current conducting paths in the pair of conductive portions may be controlled, as in the circuit patterns 13a and 13b and the circuit patterns 15a and 14b of this embodiment.

According to the disclosed embodiment, the occurrence of internal abnormal overheating is precluded to prevent a decrease in reliability.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a first conductive portion including a first conducting region and a first wiring region communicating with the first conducting region via a first communicating portion;
   a second conductive portion including a second conducting region and a second wiring region that communicates with the second conducting region via a second communicating portion and that faces the first wiring region with a prescribed space therebetween; and
   a wiring member electrically connecting the first wiring region and the second wiring region in a wiring direction, wherein
   each of the first conducting region, the first wiring region, the first communicating portion, the second conducting region, the second wiring region and the second communicating portion is of a stripe shape, and
   the first communicating portion and the second communicating portion are separate from each other when viewed from the wiring direction.

2. The semiconductor device according to claim 1, wherein:
   the first wiring region extends from the first communicating portion in a prescribed direction in the first conductive portion; and
   the second wiring region extends from the second communicating portion in a direction opposite to the prescribed direction in the second conductive portion.

3. The semiconductor device according to claim 2, wherein:
   the first communicating portion is located at an edge of the first wiring region; and
   the second communicating portion is located at an edge of the second wiring region, opposite the first communicating portion, and is separate from the first communicating portion.

4. The semiconductor device according to claim 2, wherein:
   the first conductive portion is of an L-shape in which the first conducting region communicates with the first wiring region via the first communicating portion; and
   the second conductive portion has a notch formed at a side portion thereof, the notch being opposite to the first conductive portion in the wiring direction.

5. The semiconductor device according to claim 2, wherein:
   the first conductive portion and the second conductive portion are each of an L-shape and are in point symmetry with respect to a center of the wiring member.

6. The semiconductor device according to claim 1, wherein
   a width of the first communicating portion is identical to a width of the second communicating portion.

7. The semiconductor device according to claim 1, wherein the wiring member is a plurality of wires, lead frames, or ribbon cables.

8. The semiconductor device according to claim 1, wherein a semiconductor element is disposed in at least one of the first conducting region or the second conducting region.

9. The semiconductor device according to claim 1, wherein an external terminal is electrically connected to at least one of the first conducting region or the second conducting region.

10. The semiconductor device according to claim 1, further comprising another wiring member, different from the wiring member, that electrically connects at least two points on a surface of at least one of the first conducting region or the second conducting region.

11. A semiconductor device, comprising:
    a first conductive portion including a first conducting region and a first wiring region communicating with the first conducting region via a first communicating portion;
    a second conductive portion including a second conducting region and a second wiring region that communicates with the second conducting region via a second communicating portion and that faces the first wiring region with a prescribed space therebetween; and
    a wiring member electrically connecting the first wiring region and the second wiring region in a wiring direction, wherein
    the first communicating portion and the second communicating portion are separate from each other when viewed from the wiring direction;
    each of the first and second wiring regions and the first and second conducting regions is of a stripe shape;
    the first wiring region is a wider stripe than the first conducting region in the first conductive portion; and
    the second wiring region is a wider stripe than the second conducting region in the second conductive portion.

12. The semiconductor device according to claim 11, wherein:
    the first wiring region extends in a direction perpendicular to a direction in which the first conducting region extends in the first conductive portion;
    the second wiring region extends in a direction perpendicular to a direction in which the second communicating portion extends in the second conductive portion; and
    the first conducting region and the second conducting region extend in opposite directions with the first wiring region and the second wiring region therebetween.

13. A semiconductor device, comprising:
    a first conductive portion including a first conducting region and a first wiring region communicating with the first conducting region via a first communicating portion;
    a second conductive portion including a second conducting region and a second wiring region that communicates with the second conducting region via a second communicating portion and that faces the first wiring region with a prescribed space therebetween; and
    a wiring member electrically connecting the first wiring region and the second wiring region in a wiring direction, wherein
    the first communicating portion and the second communicating portion are separate from each other when viewed from the wiring direction;

each of the first wiring region and the first conducting region is of a stripe shape, the first wiring region being a wider stripe than the first conducting region in the first conductive portion; and the second conductive portion has a notch formed therein beside the second communicating portion, the notch overlapping both the first communicating portion and the second conducting region when viewed from the wiring direction of the wiring member.

14. The semiconductor device according to claim 13, wherein:

the first wiring region extends in a direction perpendicular to a direction in which the first conducting region extends in the first conductive portion; and the second conductive portion has a side that is in an extending direction of the first wiring region, the notch extending from the side to the second communicating portion, and being wider than the first communicating portion when viewed from the wiring direction of the wiring member.

15. The semiconductor device according to claim 14, wherein:

the first conductive portion is of a T-shape in which the first conducting region communicates with the first wiring region via the first communicating portion;

the notch in the second conductive portion has a stripe shape, is opposite to the first communicating portion, and is wider than the first communicating portion in the direction in which the first conducting region extends; and the second conducting region communicates with the second wiring region via the second communicating portion located on both sides of the notch.

* * * * *